United States Patent
Cruz et al.

(10) Patent No.: US 9,018,746 B2
(45) Date of Patent: Apr. 28, 2015

(54) SOLDER FLOW IMPEDING FEATURE ON A LEAD FRAME

(71) Applicant: Intersil Americas LLC, Milpitas, CA (US)

(72) Inventors: Randolph Cruz, Melbourne, FL (US); Loyde Milton Carpenter, Jr., Palm Bay, FL (US)

(73) Assignee: Intersil Americas LLC, Milpitas, CA (US)

( * ) Notice: Subject to any disclaimer, the term of this patent is extended or adjusted under 35 U.S.C. 154(b) by 0 days.

(21) Appl. No.: 14/503,620

(22) Filed: Oct. 1, 2014

(65) Prior Publication Data

US 2015/0014835 A1    Jan. 15, 2015

Related U.S. Application Data

(62) Division of application No. 13/628,995, filed on Sep. 27, 2012, now Pat. No. 8,877,564.

(60) Provisional application No. 61/666,186, filed on Jun. 29, 2012.

(51) Int. Cl.
*H01L 23/495* (2006.01)
*H01L 23/48* (2006.01)

(52) U.S. Cl.
CPC .... *H01L 23/49513* (2013.01); *H01L 23/49562* (2013.01); *H01L 23/49575* (2013.01); *H01L 23/49541* (2013.01)

(58) Field of Classification Search
USPC ............................. 257/676, 666, 784, E23.031
See application file for complete search history.

(56) References Cited

U.S. PATENT DOCUMENTS

| | | | |
|---|---|---|---|
| 5,202,288 A | 4/1993 | Doering et al. | |
| 5,866,939 A * | 2/1999 | Shin et al. | 257/666 |
| 5,973,388 A * | 10/1999 | Chew et al. | 257/676 |
| 6,025,640 A | 2/2000 | Yagi et al. | |
| 6,130,115 A * | 10/2000 | Okumura et al. | 438/124 |
| 6,166,430 A * | 12/2000 | Yamaguchi | 257/666 |
| 6,198,171 B1 * | 3/2001 | Huang et al. | 257/787 |
| 6,208,020 B1 * | 3/2001 | Minamio et al. | 257/684 |
| 6,281,568 B1 | 8/2001 | Glenn et al. | |
| 6,400,004 B1 * | 6/2002 | Fan et al. | 257/666 |
| 6,433,277 B1 | 8/2002 | Glenn | |

(Continued)

OTHER PUBLICATIONS

U.S. Patent and Trademark Office, "Notice of Allowance", "from U.S. Appl. No. 13/628,995", Jul. 8, 2014, pp. 1-14, Published in: US.

(Continued)

*Primary Examiner* — Nitin Parekh
(74) *Attorney, Agent, or Firm* — Fogg & Powers LLC

(57) ABSTRACT

One embodiment is directed towards a packaged chip including a lead frame. At least one chip is mounted on the lead frame. At least one edge the lead frame has a solder flow impeding feature located thereon. The solder flow impeding feature includes an integral portion of the lead frame that extends in a first projection outward at an edge of the lead frame and parallel to an external surface of the lead frame. An internal surface of the first projection is aligned with an internal surface of the main portion of the lead frame. The solder flow impeding feature also includes a second projection that extends from an external side of the first projection in a direction generally perpendicular to the first projection.

15 Claims, 8 Drawing Sheets

(56) References Cited

U.S. PATENT DOCUMENTS

| | | |
|---|---|---|
| 6,638,790 B2 * | 10/2003 | Minamio et al. .............. 438/111 |
| 6,684,496 B2 | 2/2004 | Glenn |
| 8,050,048 B2 | 11/2011 | Xu et al. |
| 8,183,088 B2 | 5/2012 | Jeon et al. |
| 2002/0093026 A1 | 7/2002 | Huang |
| 2005/0003586 A1 | 1/2005 | Shimanuki et al. |
| 2012/0126378 A1 | 5/2012 | San Antonio et al. |

OTHER PUBLICATIONS

U.S. Patent and Trademark Office, "Restriction Requirement ", "from U.S. Appl. No. 13/628,995", May 16, 2014, pp. 1-4, Published in: US.

Adamson, "Lead-Free Packaging for Discrete Power Semiconductors", Apr. 2002, pp. 1-5, Publisher: International Rectifier.

* cited by examiner

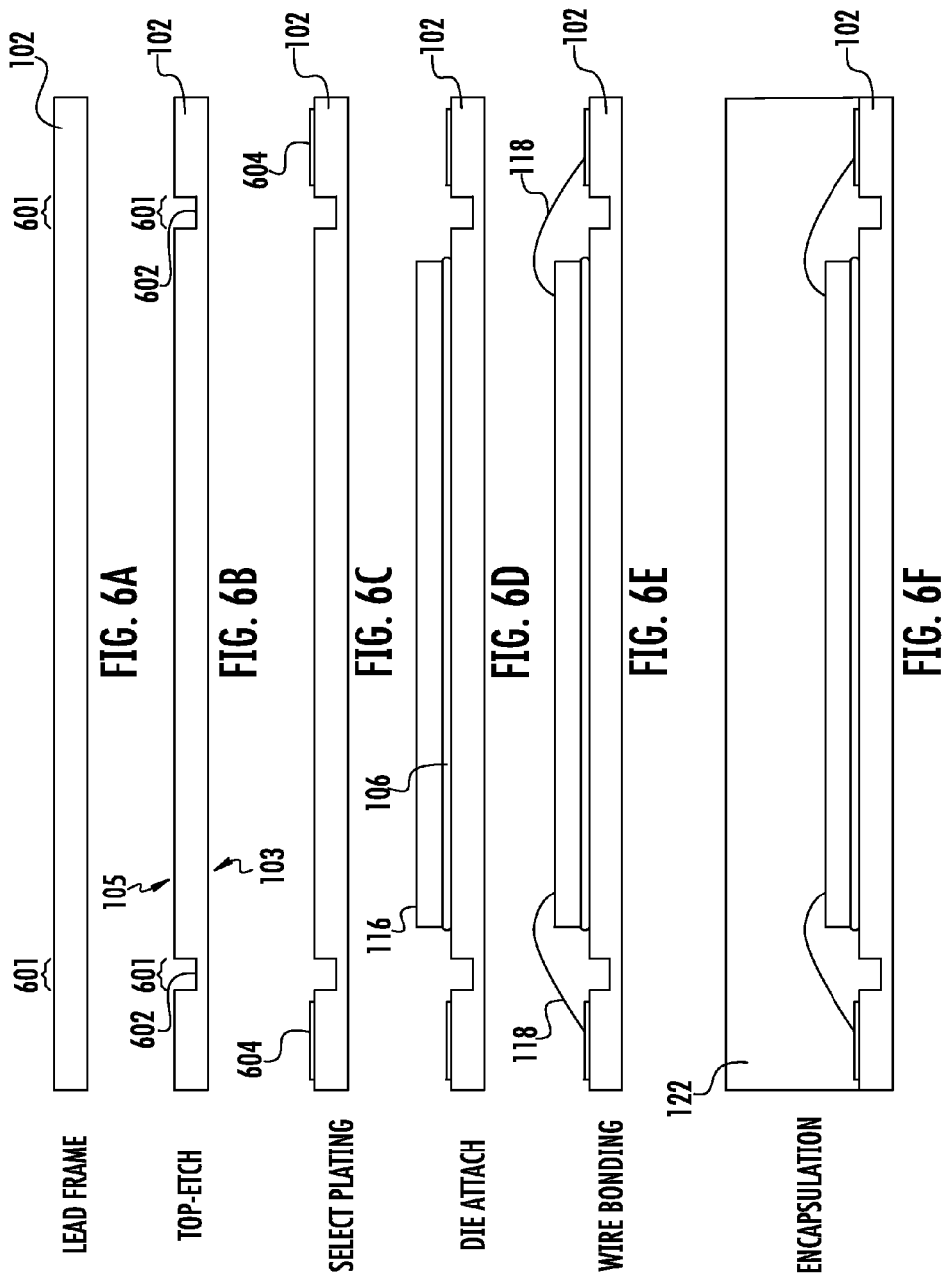

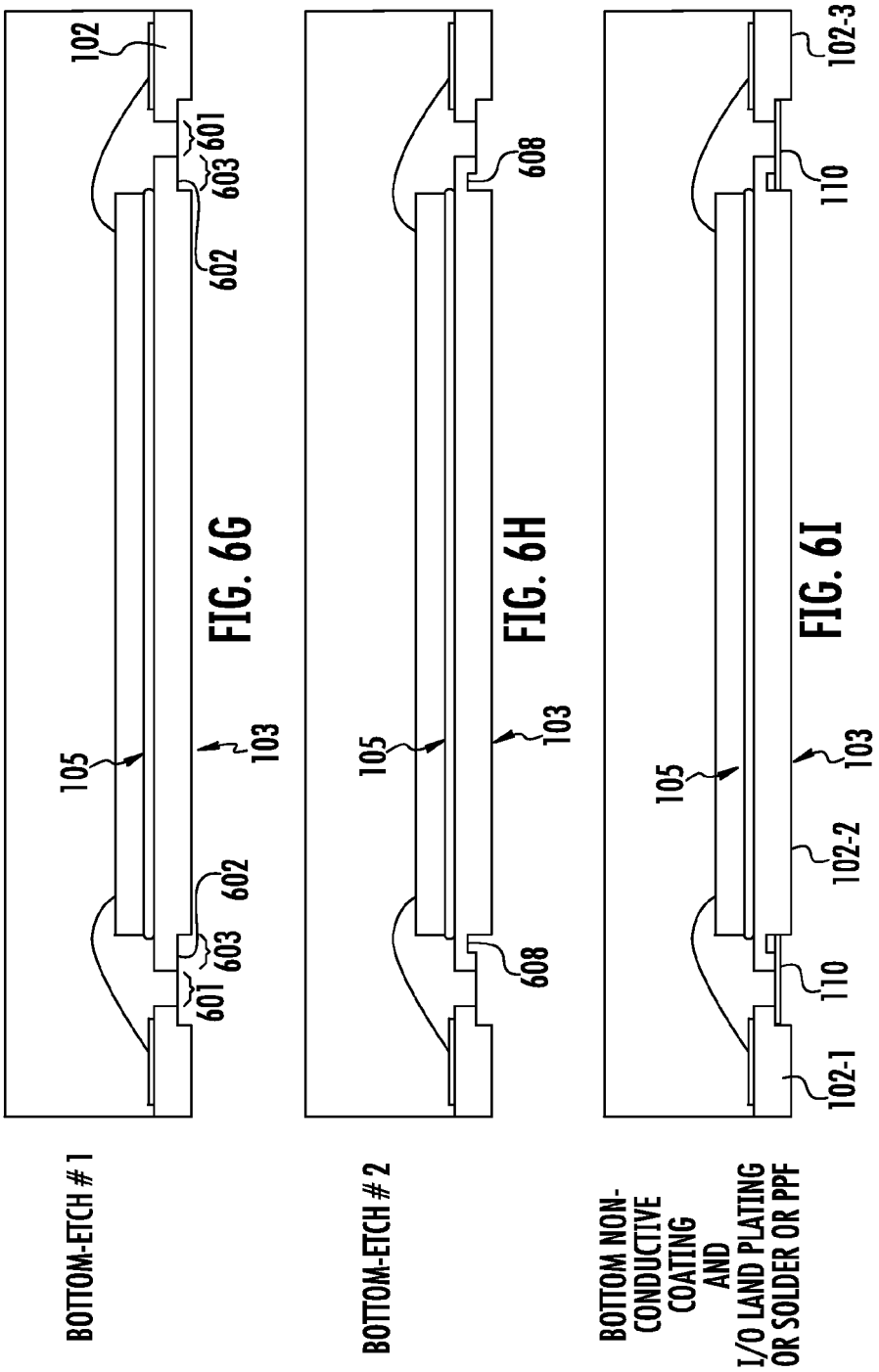

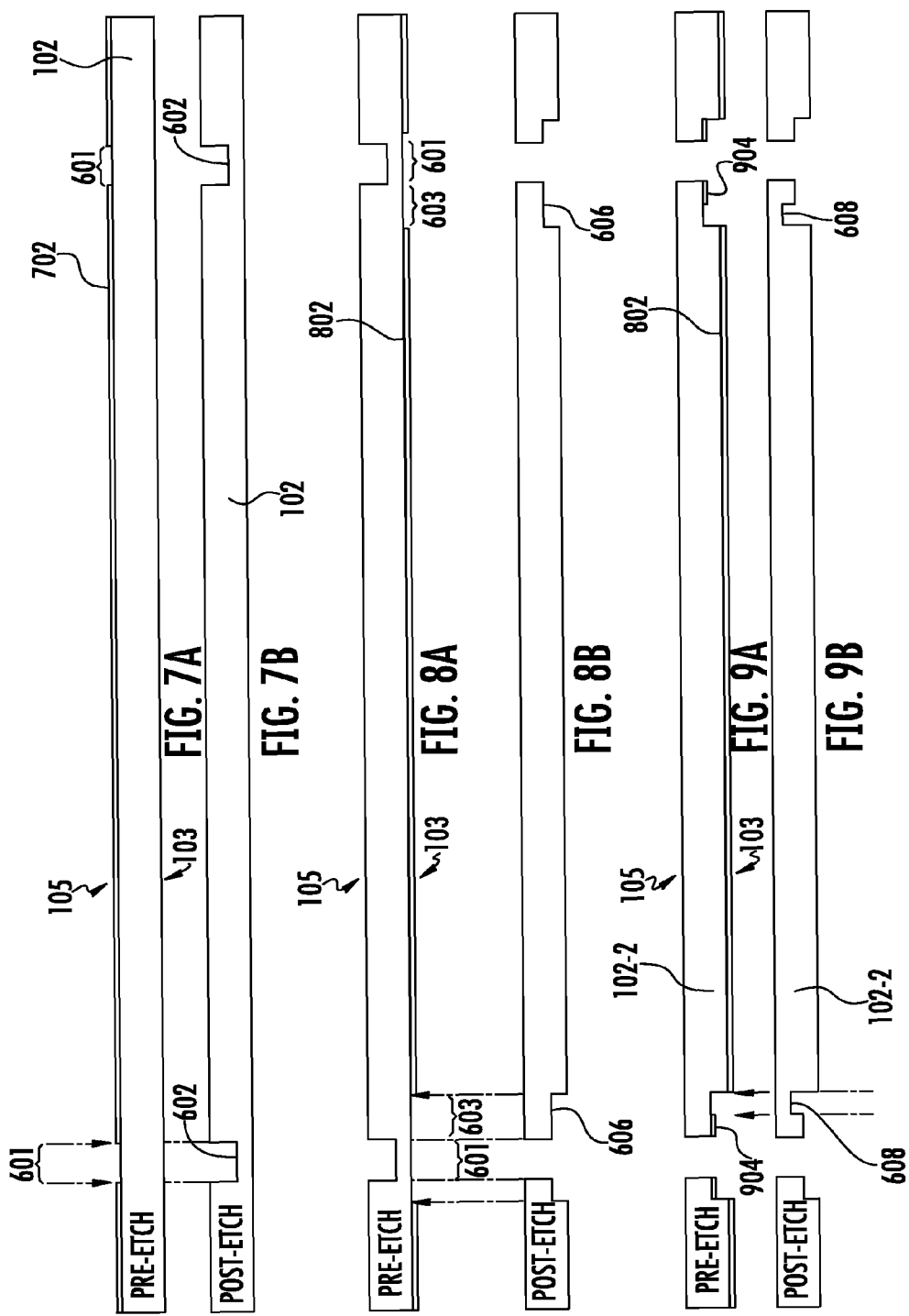

SOLDER FLOW IMPEDING FEATURE ON A LEAD FRAME

CROSS-REFERENCE TO RELATED APPLICATIONS

This application is a divisional of U.S. application Ser. No. 13/628,995, filed on Sep. 27, 2012, which claims the benefit of priority to U.S. Provisional Application No. 61/666,186, filed on Jun. 29, 2012, which is hereby incorporated herein by reference.

BRIEF DESCRIPTION OF THE DRAWINGS

FIGS. 6A-6I are cross-sectional views of example stages in a method of manufacturing a packaged circuit including solder flow impeding features.

FIGS. 7A and 7B are cross-sectional views of example stages in a first partial etching of a lead frame to form solder flow impeding features.

FIGS. 8A and 8B are cross-sectional views of example stages in a second partial etching of a lead frame to form solder flow impeding features.

FIGS. 9A and 9B are cross-sectional views of example stages in a third partial etching of a lead frame to form solder flow impeding features.

DETAILED DESCRIPTION

Figure 1:
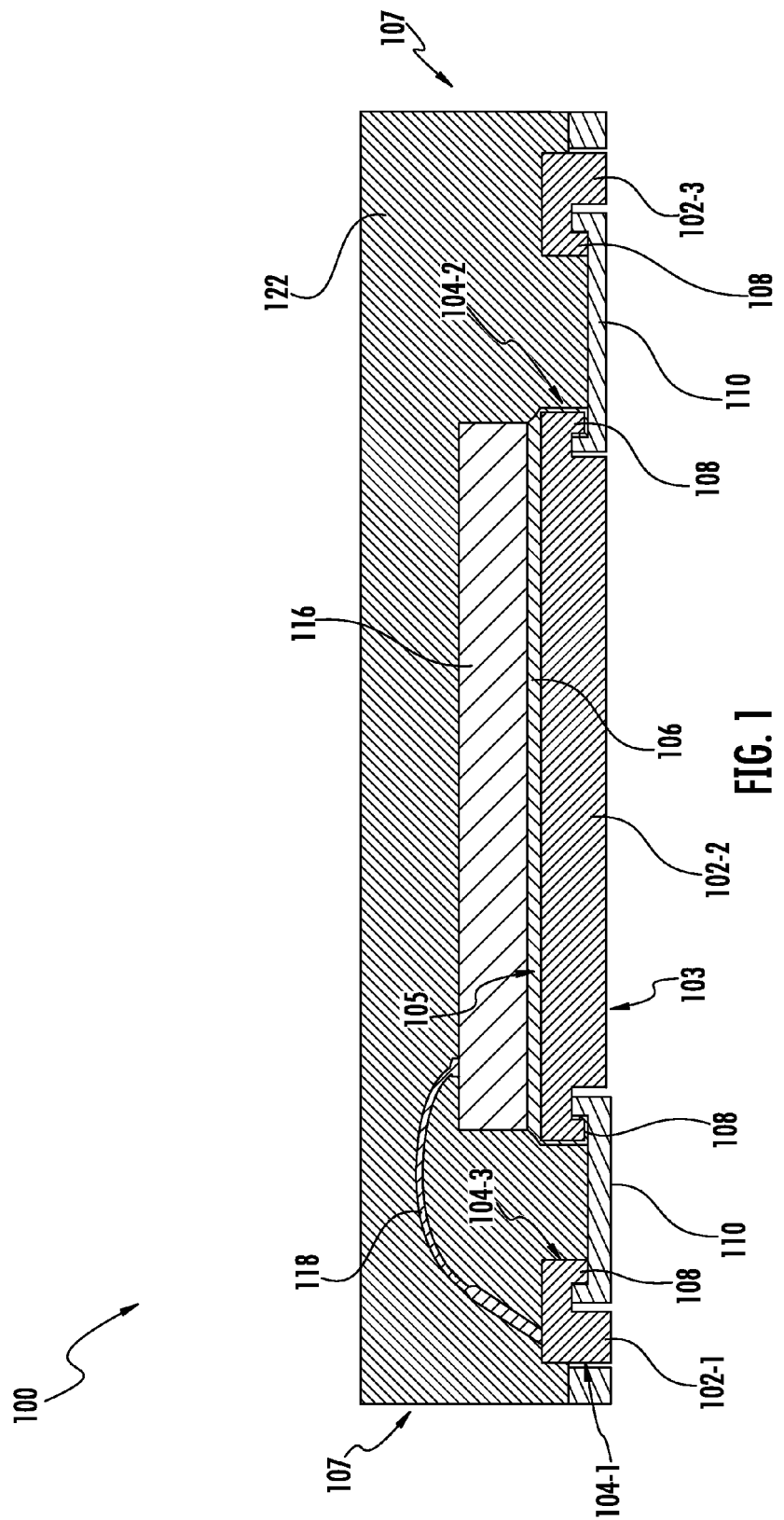
FIG. 1 is a cross-sectional view of an embodiment of a packaged circuit having a lead frame with solder flow impeding features.

FIG. 1 is a cross-sectional view of an embodiment of a packaged circuit 100 having a lead frame 102 with solder flow impeding features. The lead frame 102 of the circuit 100 is composed of a plurality of distinct and generally planar sections 102-1, 102-2, 102-3 of conductive material. The sections 102-1, 102-2, 102-3 of conductive material that are oriented such that the sections collectively have a generally planar configuration. Each section 102-1, 102-2, 102-3 comprises two primary surfaces: an external surface 103 and an internal surface 105. The external surface 103 includes a plurality of external terminals for coupling the lead frame to external circuits, and the internal surface 105 includes one or more pads for mounting of one or more dies 116. In an example, one or more of the sections (102-1, 102-2, 102-3) of conductive material can be floating, that is, one or more sections of conductive material do not abut an edge (perimeter) of the package of the packaged circuit 100. An example of a floating section is section 330 of a lead frame 102 shown in FIG. 5 which is described in more detail below. The lead frame 102 is composed of an electrically conductive material such as a metal. In an example, the lead frame 102 is composed of copper.

As shown in FIG. 1, one or more dies 116 (also referred to herein as simply "die 116") are mounted and electrically coupled to the internal surface of the lead frame 102. In an example, the packaged circuit 100 includes multiple dies in a multichip package such as, for example, to implement a power conversion system. The power conversion system can include a power stage as well as a controller and/or driver for the power stage. For example, the die 116 can include one or more of a high side FET, low side FET, or a diode (e.g., Schottky diode). Other components such as a power inductor or passive components can also be mounted on the lead frame 102. In an example, the power conversion system can comprise a DC-to-DC power converter, a charger, a hot-swap controller, an AC-DC converter, a bridge driver, a buck converter, a boost converter, a buck-boost converter, a synchronous buck converter, or a portion of any of these circuits. In another example, the packaged circuit 100 includes a single die in a single-chip package such as, for example, to implement a power stage IC or a discrete component.

The die 116 can be coupled to one or more sections 102-1, 102-1, 102-3 of the lead frame by one or more wire bonds 118, copper clip(s), aluminum ribbon(s), or other interconnect mechanism. The wire bonds 118 can be attached to the internal surface 105 of the lead frame 102 and to a top surface of the die 116. Molding compound 122 can surround the die 116 and extend partially between and around the sections 102-1, 102-2, 102-3 of the lead frame 104. The molding compound 122 can comprise any suitable molding compound such as a ceramic, plastic, or epoxy. The packaged circuit 100 also includes a solder resist 110 (e.g., an organic coating) on a bottom edge thereof in between sections 102-1, 102-2, 102-3 of the lead frame 102. Solder or another die attach adhesive 106 can be used to mechanically attach and electrically couple the die 116 to the lead frame 102 (e.g., section 102-2).

Each section 102-1, 102-2, 102-3 of the lead frame 102 has a plurality of edges 104 described herein as the surfaces of the section 102-1, 102-2, 102-3 between the internal surface 105 and the external surface 103. An edge 104 of a section 102-1, 102-2, 102-3 of the lead frame 102 can be proximate an edge 107 of the packaged circuit 100 (referred to herein as an "external edge"), as in edge 104-1, or can be internal to the package (referred to herein as an "internal edge"), as in edge 104-2 and edge 104-3. As shown in FIG. 1, one or more of the edges 104 of a section of the lead frame 102 can include a solder flow impeding feature 108.

Figure 2:
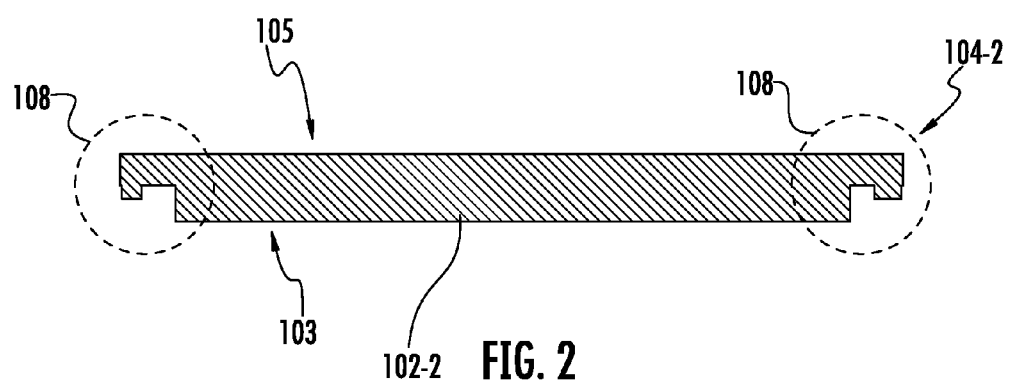
FIG. 2 is a cross-sectional view of an embodiment of a section of the lead frame of FIG. 1.
Figure 3:
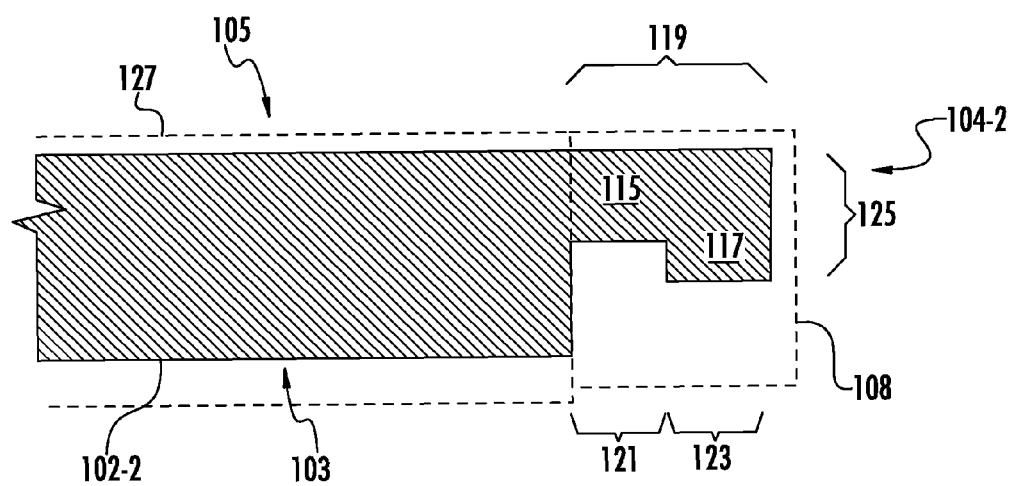
FIG. 3 is an enlarged cross-sectional view of a portion of the section of the lead frame of FIG. 1.

FIG. 2 is a cross-sectional view of the section 102-2 of the lead frame 102 individually for a less obstructed viewing of the solder flow impeding feature 108. FIG. 3 illustrates an enlarged cross-sectional view of the solder flow impeding feature 108. As shown, the solder flow impeding feature 108 comprises a portion of a section of the lead frame 102 at an edge 104 of the lead frame 102, and has a complex geometry (i.e., not a simple planar surface). The solder flow impeding feature 108 is integral with the section of the lead frame 102, and is formed from the material of the section of the lead frame 102. In the example shown in FIG. 1, the solder flow impeding feature 108 is located on internal edges of sections of the lead frame 102, and not on the external edges. In other examples, however, the solder flow impeding feature 108 can be located on external edges in addition to or instead of the internal edges. Such a solder flow impeding feature 108 can be located on any number of the edges of a section of lead frame 102 including a subset of the edges or all edges of the section of lead frame 102.

As shown in FIG. 3, the solder flow impeding feature 108 has a geometry composed of a first projection 115 and a second projection 117. The first projection 115 extends outward at an edge 104-2 of a main portion 127 of a section 102-2 of the lead frame 102. The first projection 115 extends out in a direction parallel to the internal surface 105 and defines a top surface 119 (i.e., the surface facing the same direction as the internal surface 105) of the solder flow impeding feature 108. The top surface 119 of the solder flow impeding feature 108 is an extension of the internal surface 105. That is, the top surface 119 of the solder flow impeding feature 108 is in the same plane as, and is in fact part of, the internal surface 105, such that the top surface 119 of the first projection 115 is available, similar to the rest of internal surface 105, for mounting of a die 116. In the example shown in FIGS. 1-4, the internal surface 105 extends to the terminal portion first projection 115.

The second projection 117 extends downward (i.e., in the direction in which the external surface 103 is facing) from the first projection 115. The second projection 117 extends from the first projection 115 in a direction generally orthogonal to the internal surface 105 and external surface 103 of the lead frame 102. In the example shown in FIGS. 1-3, the second projection 117 extends from the terminal portion of the first projection 115 and (along with the first projection 115) defines an outer edge surface 125 of the solder flow impeding feature 108. The geometry of the first projection 115 and second projection 117 combine to define multiple bottom surfaces 121, 123 for the solder flow impeding feature 108. The bottom surfaces 121, 123 are in different planes from one another and are in different planes than the external surface 103. Since the bottom surfaces 121, 123 are in different planes than the external surface 103, the bottom surfaces 121, 123 are distinct from the external surface 103. This is in contrast to the top surface 119, which is integral with the internal surface 105.

As can be seen in the example shown FIGS. 1-3, the geometry of the solder flow impeding feature 108, when taken together with the main portion 127 of the section 102-2, forms a general hook shape.

The geometry of the solder flow impeding feature 108 is configured to impede the free flow of the solder or other die attach adhesive 106 during a reflow event. Hereinafter the solder or other die attach adhesive 106 is referred to simply as "solder 106", however, it should be understood that other die attach adhesives can be used. In particular, the solder flow impeding feature 108 is configured to increase resistance on the flow of solder 106 along the edge 104-2 of the section 102-2 as the solder 116 attempts to flow from the internal surface 105 to the external surface 103 between the molding compound 122 and the section 102-2 of the lead frame 102. The solder flow impeding feature 108 impedes the free flow of solder 106 by providing five or more corners through which the solder 106 attempts to flow. The corners are also referred to herein as "surface breaking features", since they define breaks between distinct surfaces on the section 102-2. The five or more surface breaking features are in the path of the solder 106 when following (tracing) the surfaces along the edge 104-2 from the internal surface 105 of the section 102-2 to the external surface 103 of the section 102-2. The surface breaking feature makes it more difficult for the solder 106 to continue flowing by requiring the solder 106 to turn a corner, which increases the surface tension on the solder 106. Ideally, the corners would be right angles formed by adjacent surfaces. In practice, however, semiconductor fabrication techniques may not be so precise, and the corners may be more rounded than that shown in FIGS. 1-3.

Advantageously, the solder flow impeding features 108 described herein can restrict the flow of solder along the edges of a lead frame 102 (e.g., a section 102-1, 102-2, 102-3 thereof) without substantially enlarging the package or reducing the package internal component size. This is because the solder flow impeding features 108 described herein can be included without using any surface area on the internal surface 105, and therefore, without reducing the surface available for mounting of dies 116 and other internal connections. Accordingly, a die(s) 116 on a section 102-2 of the lead frame 102 can be mounted near an edge 104-2 of the section 102-2 and restriction on the flow of solder 106 can still occur. Additionally, since the hook shape of the solder flow impeding feature 108 defines a pocket, the solder resist 110 can extend into the pocket of the hook shaped feature 108 forming a mechanical couple between the feature 108 and the solder resist 110. Moreover, in addition to impeding the flow of solder 106 out between the lead frame 102 and the molding compound 122, the features 108 also act as a barrier to entry into the packaged circuit 100 and can, for example, reduce the ingress of moisture and external contaminants into the packaged circuit 100.

Figure 4:
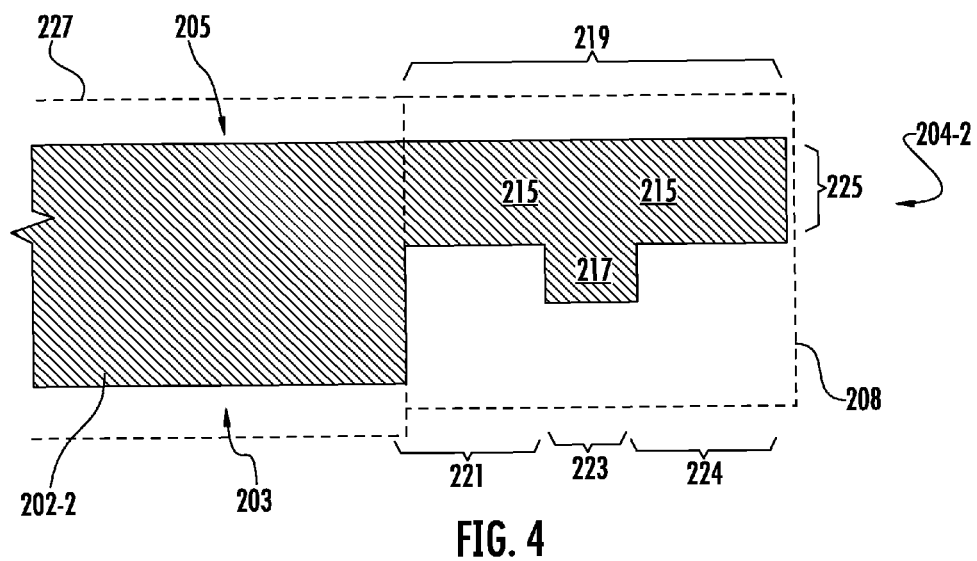
FIG. 4 is a cross-sectional view of a portion of a section of a lead frame showing another embodiment of a solder flow impeding feature.

FIG. 4 is an example of another section 202-2 of a lead frame that can be used in the lead frame 102 shown in FIG. 1. This example section 202-2 includes an alternative geometry for a solder flow impeding feature 208. Similar to the feature 108, the feature 208 has a geometry composed of a first projection 215 and a second projection 217. The first projection 215 extends out in a direction parallel to the internal surface 205 and external surface 203 of the lead frame 102. The first projection 215 extends outward at an edge 204-2 of a main portion 227 of a section 202-2 of the lead frame 102. The first projection 215 extends out in a direction parallel to the internal surface 205 and defines a top surface 219 (i.e., the surface facing the same direction as the internal surface 205) of the solder flow impeding feature 208. The top surface 219 of the solder flow impeding feature 208 is an extension of the internal surface 205. That is, the top surface 219 of the solder flow impeding feature 208 is in the same plane as, and is in fact part of, the internal surface 205, such that the top surface 219 of the first projection 215 is available, similar to the rest of internal surface 205, for mounting of a die 116. In the example shown in FIG. 4, the internal surface 205 extends to the terminal portion first projection 215. The first projection 215 also defines an edge surface 225.

The second projection 217 extends downward (i.e., in the direction in which the external surface 203 is facing) from the first projection 215. The second projection 217 extends from the first projection 215 in a direction generally orthogonal to the internal surface 205 and external surface 203. In the example shown in FIG. 4, the second projection 217 is disposed inward from a terminus of the first projection 215. Accordingly, the second projection 217 extends from a middle portion of the first projection 215. In particular, feature 208 includes seven surface breaking features. The geometry of the first projection 215 and the second projection 217 combine to define multiple bottom surfaces 221, 223, 224. In this example, each of the bottom surfaces 221, 223, 224 is in a different plane than the external surface 203. The bottom surfaces 221 and 224 are in the same plane with the bottom surface 223 in a different plate. This feature 208 forms a hook shape with the main portion 227; however, a further extension outward from the hook shape adds additional corners (surface breaking features) to the path of the solder 106.

Although two example cross-sections for a solder flow impeding feature are shown, it should be understood that other geometries can be used. Moreover, a single packaged circuit and/or lead frame can include solder flow impeding features having different geometries, or all features can have the same geometry.

Figure 5:
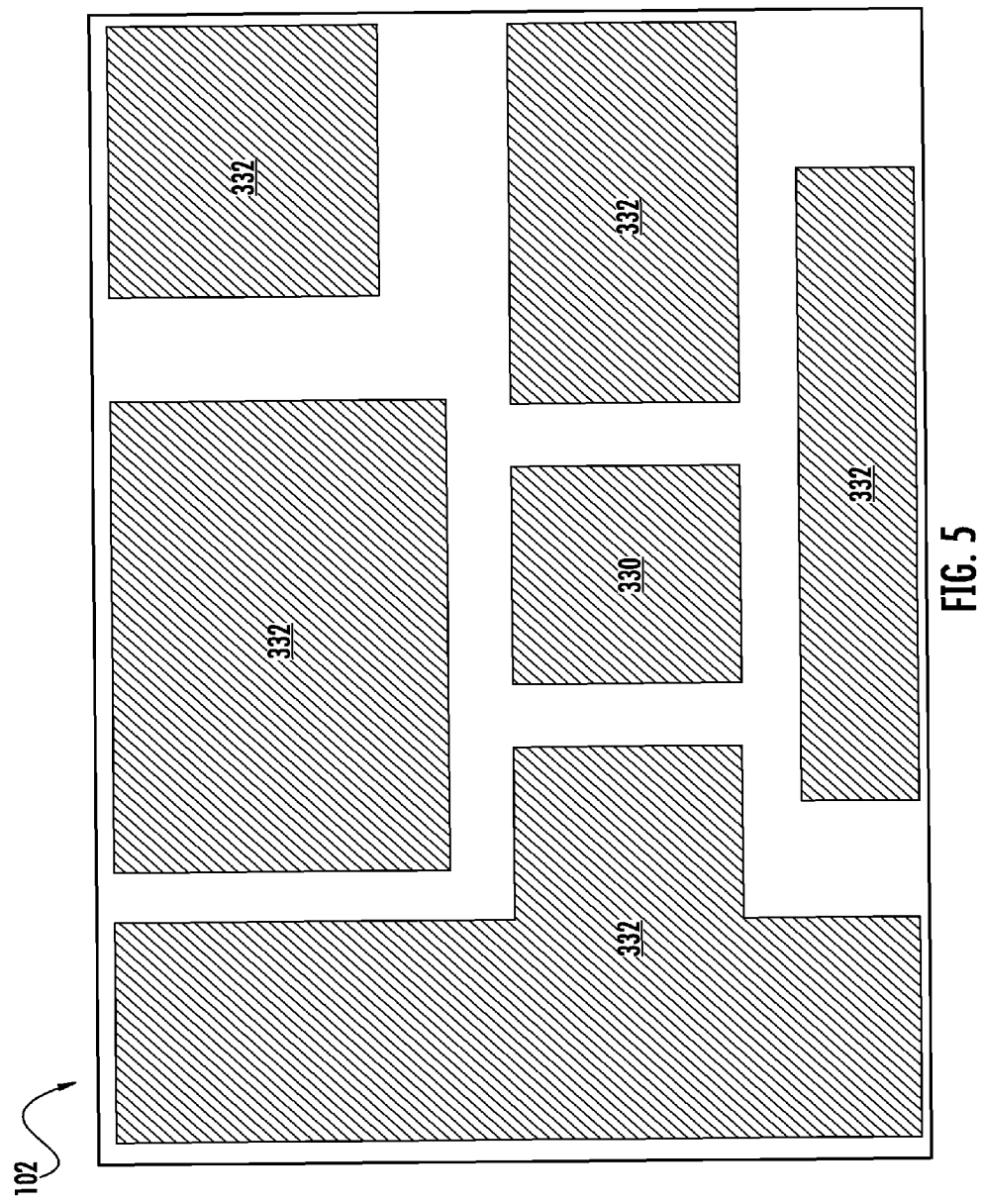
FIG. 5 is a top cross-sectional view the lead frame of FIG. 1.

FIG. 5 is a top cross-sectional view of an example lead frame 102 for the packaged circuit 300. As shown, the lead frame 102 includes both edge sections 332 and a floating section 330; with the edge sections 332 abutting at least one edge of the packaged circuit 300 and the floating section 330 that does not abut an edge of the packaged circuit 300. Although in this example only a single floating section 330 is shown, other examples can include more than one floating section 330. The edge sections 332 and floating section 330 can include any appropriate external terminal(s) such as a pad or lead.

Manufacturing the circuit 100 into a package can include manufacturing a plurality of the packaged circuits 100 at the same time. Accordingly, a plurality of chip lead frames 102 can be assembled adjacent to one another, each having appropriate dies 116 mounted thereon. Once assembled, the lead frames 102 and associated components can be singulated to form the individual packaged systems. The following description refers to the process of forming a single packaged circuit 100, but it should be understood that the process can involve forming a plurality of packaged circuits 100 at the same time.

FIGS. 6A-6I are cross-sectional views of example stages in a method of manufacturing a packaged circuit including one or more solder flow impeding features. The lead frame 102 and one or more dies 116 to be mounted thereon are obtained. The die(s) can be fabricated as a die (e.g., a monolithic substrate) using appropriate semiconductor processes. FIG. 6A shows a blank lead frame 102.

The lead frame 102 can be partially etched, as a first partial etch, from the internal (top) surface 105 along dividing lines 601, which correspond to the spaces between sections of the final lead frame 102. The first partial etch is referred to as a "partial" etch since the first partial etch extends only a portion of the way through the lead frame 102 from the internal surface 105 to the external (bottom) surface 103. The first partial etch results in a lead frame 102 having a plurality of trenches 602 defined in the internal surface 105 as shown in FIG. 6B. FIG. 7A is a cross-sectional view of an example of the resist 702 on the internal surface 105 of the lead frame 102; and no resist is placed on the dividing lines 601 where the lead frame 102 is to be removed with the etch. FIG. 7B is a cross-sectional view of the lead frame 102 after the first partial etch showing the trenches 602 formed thereby. In an example, the first partial etch extends between 50 and 75% of the way through the lead frame 102 and, in a particular example, extends around 62% of the way through the lead frame 102 which can be about 0.125 mm into the top surface. In other examples, the first partial etch can extend in other distances.

After the first partial etch, plating 604 can be deposited on the internal surface 105 of the lead frame 102 as shown in FIG. 6C. The die(s) 116 can be mounted on solder paste 106 on the internal surface 105 of the lead frame 102 as shown in FIG. 6D. In an example, the internal surface 105 of the lead frame 102 can be coated with the solder paste 106 using a solder mask and solder paint or a plurality of solder balls. In any case, the die 116 can be aligned with and placed on the lead frame 102. In particular, each die 116 can be placed such that it is mounted to a future section (102-1, 102-2, 102-3) of the lead frame 102. As used herein a future section of the lead frame 102 refers to a portion of the lead frame 102 that will be disconnected from other portions of the lead frame 102 after the second partial etch described herein. In some examples, the solder can be reflowed once the die(s) 116 are in position on the lead frame 102.

In some examples, wire bond(s) 118, copper clip(s), aluminum ribbon(s), or other interconnect mechanism can be attached to the die(s) 116 and lead frame 102 to achieve desired coupling as shown in FIG. 6E. Once the die(s) 116 have been mounted and all appropriate electrical connections have been made, molding compound 122 can be flowed over the die(s) 116 and the lead frame 102 to encapsulate the die(s) 116 and the lead frame 102. In a process forming a plurality of packaged circuits at the same time, molding compound 122 can be flowed over the plurality of assembled circuits. Once applied, the molding compound 122 can be cured resulting in the structure shown in FIG. 6F.

Once the molding compound 122 is cured, the external surface 103 of the lead frame 102 can be etched as a second partial etch. The second partial etch can overlap the dividing lines 601 between future sections of the lead frame. Similar to the first partial etch, the second partial etch extends a portion of the way through the lead frame from the external surface 103 to the internal surface 105. The second partial etch can be aligned with the first partial etch and extend through the lead frame 102 enough to meet the first partial etch to disconnect and electrically de-couple different sections 102-1, 102-2, 102-3 of the lead frame 102 at the dividing lines 601. That is, the second partial bottom etch occurs at a location on the lead frame 102 opposite the first partial etch such that the combination of the first partial etch and the second partial etch etches entirely through the lead frame 102 and disconnects different sections of the lead frame 102 from one another. The second partial etch removes a laterally wider portion of the lead frame 102 than the first partial etch. In particular, the second partial etch is laterally wider than the first partial etch on the side(s) of the first partial etch at which solder flow impeding features 108, 208 are to be formed. The second partial etch results in a plurality of trenches 606 defined in the external surface 103, where a portion of the trenches 606 extend all the way through the lead frame 102. The portion of the resulting space between the sections 102-1, 102-2, 102-3 that was formed by the first partial etch is filled with molding compound 122 from encapsulation. The second partial etch forms the bottom surface 123, 223 of the second projection 117, 217.

FIG. 8A is a cross-sectional view of an example of a resist 802 on the external surface 105 of the lead frame 102 (not showing the other components of the packaged circuit 100). No resist 802 is placed on the dividing lines 601 or lateral portions 603 adjacent to the dividing lines 601 where a surface flow impeding feature 108 is to be formed. FIG. 8B is a cross-sectional view of the lead frame 102 after the second partial etch showing the trenches formed thereby. The second partial etch extends 25 to 40% of the way through the lead frame 102 (based on the thickness of the lead frame 102 prior to the first partial etch). In a particular example, the second partial etch extends around 37% of the way through the lead frame 102 which, in this example, is 0.075 mm. In other examples, the second partial etch can extend in other distances.

After the second partial etch, a third partial etch can be performed in order to form the pocket 608 of the hook shaped solder flow impeding feature 108, 208. To form the pocket, the third partial etch overlaps a portion of the area etched by the second partial etch. Consequently, the third partial etch extends farther into the lead frame 102 than the second partial etch. The third partial etch forms the bottom surface(s) of the first projection 117, 217, which includes the bottom surface 121 for the solder flow impeding feature 108 and the bottom surfaces 221, 224 for the solder flow impeding feature 208. The third partial etch is disposed so that a portion of the bottom surface formed by the second partial etch that is adjacent to the main portion 127, 227 of the section 102-2, 202-2 of the lead frame 102 is removed, thereby forming the pocket 608 of the hook shape and the bottom surface 121, 221. In examples where the solder flow impeding feature 208 has the geometry shown in FIG. 4, the third partial etch also removes a portion of the bottom surface formed by the second partial etch that is nearest the dividing line 601 (the edge of the section 202-2), thereby forming the bottom surface 224. The third partial etch is narrower laterally than the second partial etch such that the second projection 117, 217 is present after the third partial etch.

FIG. 9A is a cross-sectional view of an example of a resist 902 on the external surface 103 of the lead frame 102 (not showing the other components of the packaged circuit 100). The resist 902 covers substantially all of the external surface 103 of the main portion 127, 227 and also covers a portion 904 of the bottom surface formed by the second partial etch. The portion 902 of the bottom surface formed by the second partial etch that is covered by the resist 902 is spaced from the main portion 127, 227 of the section 102-2, 202-2 of the lead frame 102. The portion 902 covered by the resist 902 forms the bottom surface 123, 223 of the second projection 117, 217. The third partial etch, therefore, etches the portion of the bottom surface formed by the second partial etch that is adjacent to the main portion 127, 227. FIG. 9B is a cross-sectional view of the lead frame 102 after the third partial etch showing the pocket 608 formed thereby. The third partial etch extends 1 to 10% farther into the lead frame 102 than the second partial etch (based on the thickness of the lead frame 102 prior to the first partial etch). In a particular example, the third partial etch extends 40% of the way into the lead frame 102, which, in this example, is 0.050 mm from the external surface 103. In other examples, the third partial etch can extend in other distances.

The above method corresponds to solder flow impeding feature 108. Modifications to method can be made as known to those skilled in the art to form other geometries of solder flow impeding features 108. For example and a mentioned above, where a feature having the geometry of solder flow impeding feature 208 is formed, the third partial etch also includes etching a terminal area of the portion in the bottom surface that was formed by the second partial etch, and leaving an area between the terminal area and the inward area un-etched by the second partial bottom etch.

After all etching is complete, a non-conductive solder resist coating 110 can be applied between the sections 102-1, 102-2, 102-3 of the lead frame 102 and wherever else appropriate resulting in the packed circuit 100 shown in FIG. 6I. Additionally, input/output land plating, solder, or the like can be applied to the external surface 103 of the lead frame 102.

When forming a plurality of packaged circuits at the same time, the combined multiple packaged circuits can then be singulated to form a plurality of packaged circuits.

The orientations and directions stated and illustrated in this application should not be taken as limiting. For example, the directions, e.g., "top" and "bottom", are merely illustrative and do not correspond to absolute orientations. That is, a "top" or "bottom" surface refers merely to a relative orientation with respect to the lead frame and is not an absolute direction. For example, in actual electronic applications, a packaged chip may well be turned on its "side", causing the "bottom surface" described herein to face sidewise.

What is claimed is:

1. A packaged chip comprising:
   a lead frame having a plurality of sections of conductive material, the plurality of sections including at least one floating section that does not abut against an edge of the lead frame, each section of the lead frame having a plurality of edges;
   at least one chip mounted on a section of the lead frame;
   wherein the section includes an edge having a solder flow impeding feature located thereon, the solder flow impeding feature including an integral portion of the section of the lead frame that extends in a first projection outward at an edge of the section and parallel to an external surface of the section, wherein an internal surface of the first projection is co-planar with an internal surface of a main portion of the section, the solder flow impeding feature also including a second projection that extends from an external side of the first projection in a direction generally perpendicular to the first projection, wherein a surface of the second projection that faces the same direction as the external surface of the section is disposed inward of the external surface of the section, wherein the solder flow impeding feature forms a general hook shape, wherein a pocket of the hook shape is disposed toward the external surface of the section.

2. The packaged chip of claim 1, wherein second projection extends from and aligns with a terminal portion of the first projection.

3. The packaged chip of claim 1, wherein the second projection extends from a middle portion of the first projection.

4. The packaged chip of claim 1, comprising:
   a solder resist on portions of the external surface of the section, wherein the solder resist extends into the pocket of the solder flow impeding feature forming a mechanical couple between the solder flow impeding feature and the solder resist.

5. The packaged chip of claim 1, wherein the solder flow impeding feature forms at least five surface break features.

6. The packaged chip of claim 1, wherein two adjacent sections have solder flow impeding features on adjacent edges.

7. The packaged chip of claim 1, wherein the solder flow impeding feature extends around the entire perimeter of the at least one section.

8. A circuit comprising:
   a section of a lead frame having an internal surface, an external surface, and one or more edges;
   one or more components attached to the internal surface of the section;
   molding compound on the section and around the one or more components;
   wherein at least one of the one or more edges of the section includes a solder flow impeding feature located thereon, the solder flow impeding feature including an integral portion of the section that extends in a first projection outward at the at least one edge and parallel to an external surface of the section, wherein an internal surface of the first projection is co-planar with the internal surface of the section, the solder flow impeding feature also including a second projection that extends from an external side of the first projection in a direction generally perpendicular to the first projection, wherein the second projection extends to a point in between a plane defined by the internal surface of the section and a plane defined by the external surface of the section, wherein the solder flow impeding feature has a general hook shape, wherein a pocket of the hook shape is disposed toward the external surface of the lead frame.

9. The circuit of claim 8, wherein the second projection extends from and is co-planar with a terminal portion of the first projection.

10. The circuit of claim 8, wherein the second projection extends from an intermediate portion of the first projection.

11. The circuit of claim 9, comprising:
a solder resist on portions of the external surface of the lead frame, wherein the solder resist extends into the pocket of the solder flow impeding feature forming a mechanical couple between the solder flow impeding feature and the solder resist.

12. The circuit of claim 8, wherein the solder flow impeding feature forms at least five surface break features.

13. The circuit of claim 8, wherein the solder flow impeding feature extends around the entire perimeter of the lead frame.

14. A circuit comprising:
a lead frame including a section having an internal surface, an external surface, and one or more edges;
one or more components attached to the internal surface of the section;
molding compound on the lead frame and around the one or more components;
wherein at least one of the one or more edges of the section includes a solder flow impeding feature located thereon, the solder flow impeding feature having a hook shape, wherein a pocket of the hook shape opens toward the external surface of the lead frame, and wherein a terminal portion of the hook shape defines a terminal surface that faces the same direction as the external surface of the section, wherein the terminal surface is disposed in between a plane defined by the internal surface of the section and a plane defined by the external surface of the section.

15. The circuit of claim 14, the circuit comprising:
a solder resist on portions of an external surface of the circuit, wherein the solder resist extends into the pocket of the solder flow impeding feature forming a mechanical couple between the solder flow impeding feature and the solder resist.

* * * * *

UNITED STATES PATENT AND TRADEMARK OFFICE
CERTIFICATE OF CORRECTION

PATENT NO.       : 9,018,746 B2                                             Page 1 of 1
APPLICATION NO.  : 14/503620
DATED            : April 28, 2015
INVENTOR(S)      : Cruz et al.

It is certified that error appears in the above-identified patent and that said Letters Patent is hereby corrected as shown below:

In the Claims

At column 9, lines 10-11, Claim 13, please replace "entire perimeter of the lead frame" with --entire perimeter of the section--

Signed and Sealed this
Twenty-ninth Day of September, 2015

Michelle K. Lee
*Director of the United States Patent and Trademark Office*